United States Patent
Chidambarrao et al.

(10) Patent No.: US 7,348,635 B2
(45) Date of Patent: Mar. 25, 2008

(54) DEVICE HAVING ENHANCED STRESS STATE AND RELATED METHODS

(75) Inventors: Dureseti Chidambarrao, Weston, CT (US); Ying Li, Newburgh, NY (US); Rajeev Malik, Pleasantville, NY (US); Shreesh Narasimha, Beacon, NY (US); Haining Yang, Wappingers Falls, NY (US); Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 189 days.

(21) Appl. No.: 10/905,025

(22) Filed: Dec. 10, 2004

(65) Prior Publication Data

US 2006/0128091 A1 Jun. 15, 2006

(51) Int. Cl.
*H01L 31/00* (2006.01)

(52) U.S. Cl. ............................. 257/369; 257/E27.062
(58) Field of Classification Search ................ 257/369
See application file for complete search history.

(56) References Cited

U.S. PATENT DOCUMENTS 6,876,053 B1* 4/2005 Ma et al. ................. 257/500
2004/0029323 A1* 2/2004 Shimizu et al. ............ 438/142

FOREIGN PATENT DOCUMENTS

WO WO0243151 * 5/2002

* cited by examiner

*Primary Examiner*—B. William Baumeister
*Assistant Examiner*—Matthew L. Reames
(74) *Attorney, Agent, or Firm*—Wenjie Li; Hoffman, Warnick & D'Alessandro LLC

(57) ABSTRACT

The present invention provides a semiconductor device having dual nitride liners, which provide an increased transverse stress state for at least one FET and methods for the manufacture of such a device. A first aspect of the invention provides a method for use in the manufacture of a semiconductor device comprising the steps of applying a first silicon nitride liner to the device and applying a second silicon nitride liner adjacent the first silicon nitride liner, wherein at least one of the first and second silicon nitride liners induces a transverse stress in a silicon channel beneath at least one of the first and second silicon nitride liner.

17 Claims, 4 Drawing Sheets

DEVICE HAVING ENHANCED STRESS STATE AND RELATED METHODS

BACKGROUND OF THE INVENTION

(1) Technical Field

The present invention relates generally to semiconductor devices and more particularly to a device having a PFET and dual etch stop liners that provide an enhanced stress state to the PFET and methods for the manufacture of such a device.

(2) Related Art

In the manufacture of semiconductor devices, silicon nitride ($Si_3N_4$) liners may be used to induce a stress in a transistor channel to modulate carrier mobility. The stress induced is dependent upon the stress state of the silicon nitride liner itself and the relative location of the portion of the silicon channel of interest. For example, a tensile silicon nitride liner will produce the opposite stress beneath itself and the same stress in areas laterally adjacent itself. That is, a tensile silicon nitride liner will produce a compressive stress beneath itself and a tensile stress in areas laterally adjacent the silicon layer.

FIGS. 1-3 show the induction of tensile and compressive stresses in a silicon layer 130. Referring to FIG. 1, a tensile silicon nitride liner 160 has been overlaid on silicon layer 130 of device 100. Tensile silicon nitride liner 160 induces a compressive stress 162 in a portion of silicon layer 130 beneath itself while also inducing a tensile stress 164 in a laterally adjacent portion of silicon layer 130. Similarly, FIG. 2 shows a compressive silicon nitride liner 170 atop silicon layer 130 of device 100. Compressive silicon nitride liner 170 induces a tensile stress 174 in a portion of silicon layer 130 beneath itself while inducing a compressive stress 172 in a laterally adjacent portion of silicon layer 130.

Referring to FIG. 3, device 100 is shown having abutting tensile silicon nitride liner 160 and compressive silicon nitride liner 170, which results in enhanced compressive and tensile stresses beneath the liners. That is, while tensile silicon nitride liner 160 produces its own compressive stress 162 beneath itself, as shown in FIG. 1, the abutting compressive silicon nitride liner 170 also produces a compressive stress 172 beneath a portion of tensile silicon nitride liner 160, as shown in FIG. 2. Similarly, while compressive silicon nitride liner 170 produces its own tensile stress 174 beneath itself, as in FIG. 2, abutting tensile silicon nitride liner 160 also produces a tensile stress 164 beneath a portion of compressive silicon nitride liner 160. As shown in FIG. 3, the compressive stresses 162, 172 and tensile stresses 164, 174 produced by such an arrangement of silicon nitride liners are collectively greater than would result if the liners 160, 170 did not abut.

Such increases in stress can be useful, for example, in improving the function of certain components of a semiconductor device, particularly field effect transistors (FETs). FIG. 4 shows the preferred stress states of an n-channel FET (NFET) 240 and a p-channel FET (PFET) 250 along their longitudinal (lengthwise) and transverse (widthwise) axes, L and W, respectively. Each FET 240, 250 includes a source 242, 252, a gate 244, 254, and a drain 246, 256, respectively. The function of NFET 240 is improved when NFET 240 is subjected to tensile stresses T along both its longitudinal axis L and transverse axis W. The function of PFET 250, on the other hand, is improved when PFET 250 is subjected to compressive stress C in a direction parallel to its longitudinal axis L and tensile stress T in a direction parallel to its transverse axis W. Such improved function includes, for example, improved electron transport and improved hole transport.

Devices known in the art improve FET function by increasing tensile stresses along the FET's longitudinal axis. As shown in FIG. 4, however, FET function can also be improved by increasing tensile stresses along the FET's transverse axis. Accordingly, a need exists for a device having improved FET function due to increased transverse stress, as well as methods for the manufacture of such a device.

SUMMARY OF THE INVENTION

The present invention provides a semiconductor device having dual nitride liners, which provide an increased transverse stress state for at least one FET and methods for the manufacture of such a device. A first aspect of the invention provides a method for use in the manufacture of a semiconductor device comprising the steps of applying a first silicon nitride liner to the device and applying a second silicon nitride liner adjacent the first silicon nitride liner, wherein at least one of the first and second silicon nitride liners induces a transverse stress in a silicon channel beneath at least one of the first and second silicon nitride liner.

A second aspect of the invention provides a semiconductor device comprising a first silicon nitride liner, a second silicon nitride liner laterally adjacent the first silicon nitride liner, and a silicon channel beneath a portion of the second silicon nitride liner, wherein the first silicon nitride liner induces a transverse stress in a portion of the silicon channel beneath the second silicon nitride liner.

A third aspect of the invention provides a semiconductor device comprising a first silicon nitride liner, a p-channel field effect transistor, a second silicon nitride liner residing substantially atop the p-channel field effect transistor, and a silicon channel residing substantially beneath the p-channel field effect transistor, wherein the first silicon nitride liner induces a stress in the silicon channel substantially perpendicular to a source-to-drain axis of the p-channel field effect transistor.

A fourth aspect of the invention provides a semiconductor device comprising a first silicon nitride liner, a second silicon nitride liner, a p-channel field effect transistor, a third silicon nitride liner residing substantially atop the p-channel field effect transistor, and a silicon channel residing substantially beneath the p-channel field effect transistor, wherein each of the first and second silicon nitride liners induces a stress in the silicon channel substantially perpendicular to a source-to-drain axis of the p-channel field effect transistor.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DETAILED DESCRIPTION OF THE INVENTION

Figure 1:
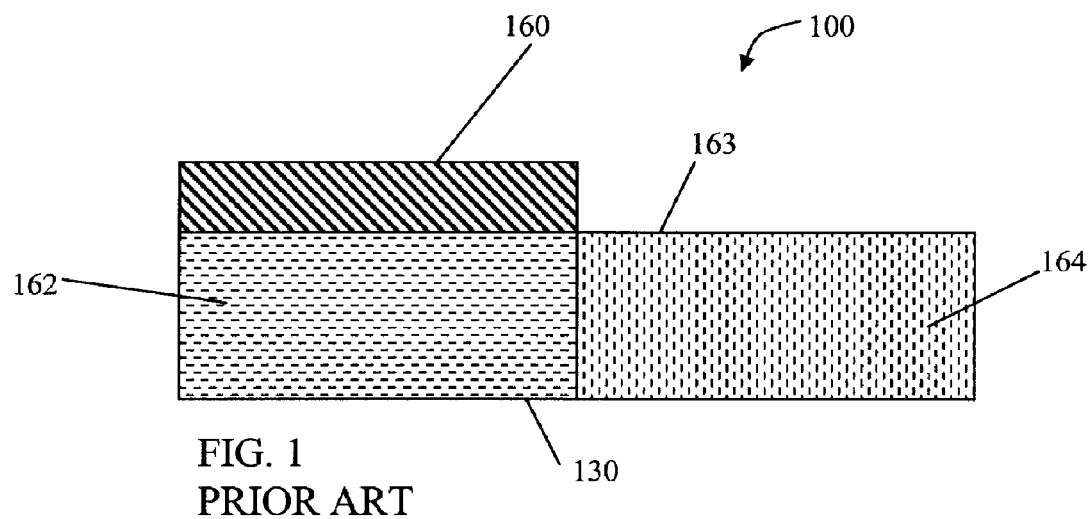
FIGS. 1-3 show prior art stresses induced in a silicide layer by overlaid tensile and compressive silicon nitride liners.
Figure 2:
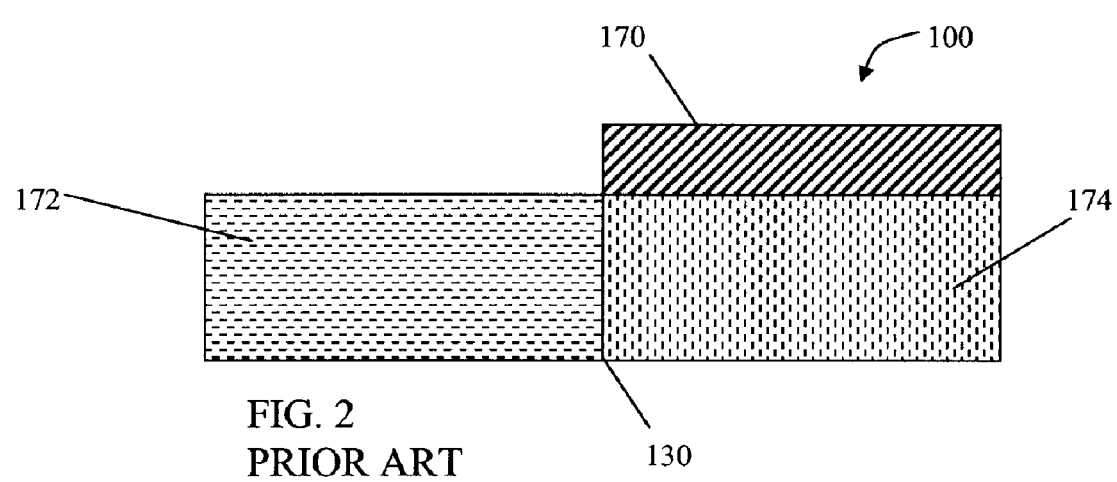
Figure 3:
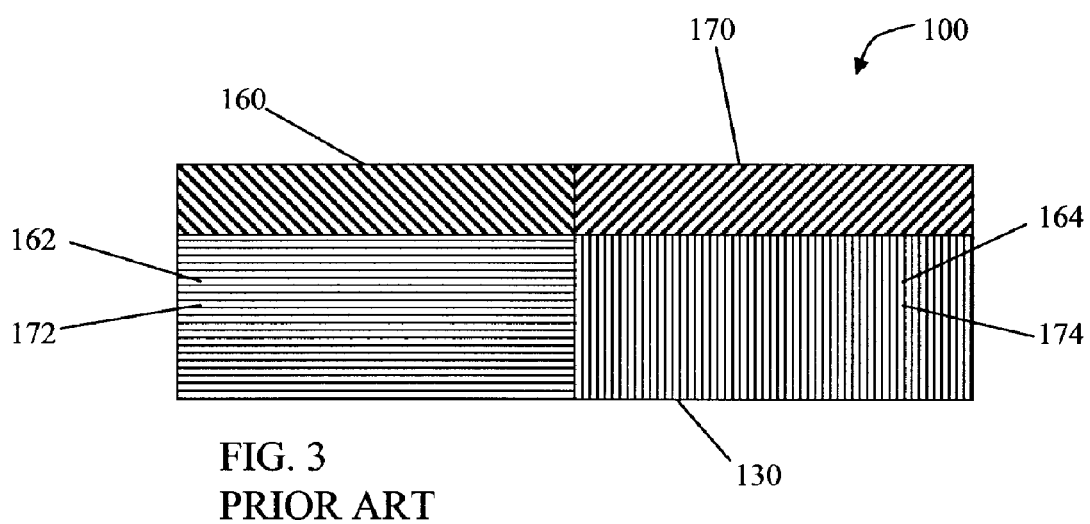
Figure 4:
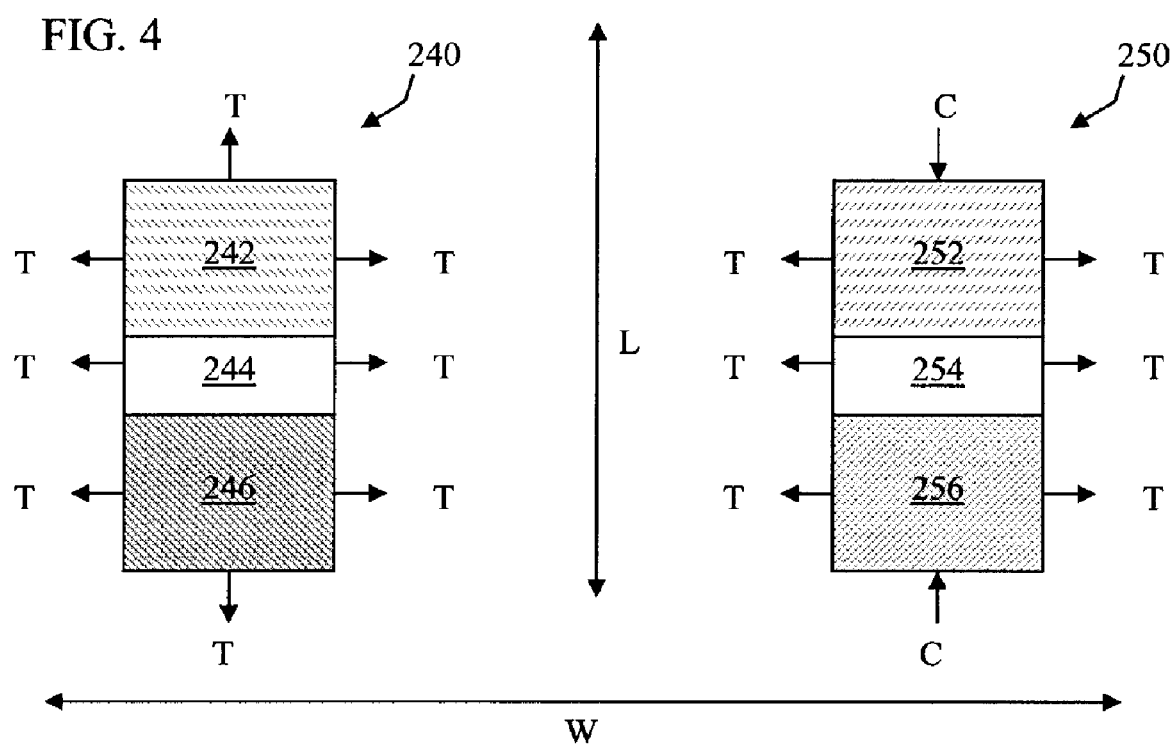
FIG. 4 shows preferred stress states for improved performance of NFETs and PFETs.
Figure 5:
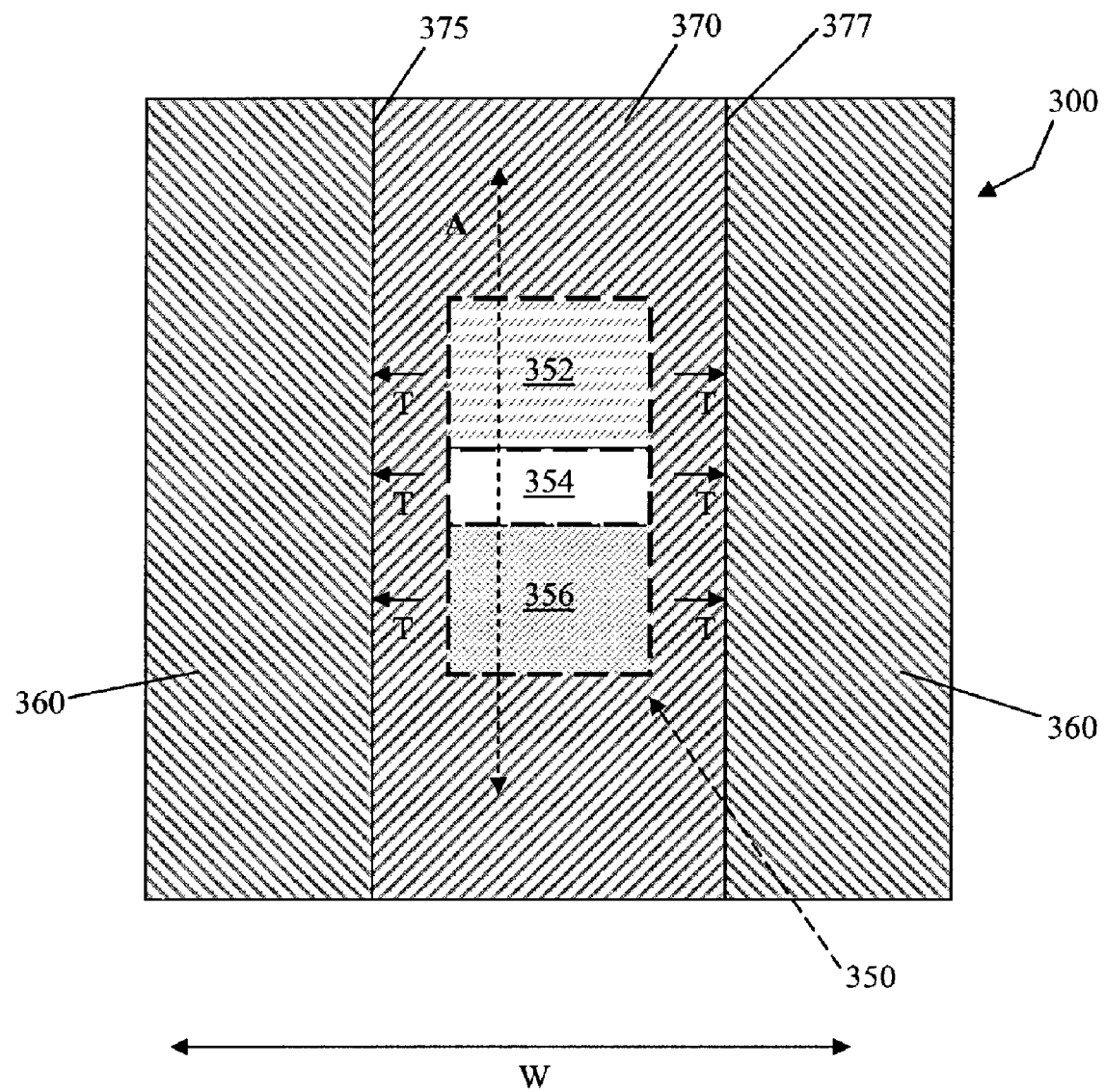
FIG. 5 shows a top view of a semiconductor device of the present invention.

Referring now to FIG. 5, a device 300 is shown comprising a PFET 350 (shown in phantom and comprising source 352, gate 354, and drain 356) beneath compressive silicon nitride liner 370, which is bounded along each of its longitudinal edges 375, 377 by tensile silicon nitride liner 360. The abutting of tensile silicon nitride liner 360 and compressive silicon nitride liner 370 induces tensile stress T beneath compressive silicon nitride liner 370 running parallel to transverse axis W. That is, tensile stress T is induced perpendicular to a "source-to-drain" axis of PFET 350.

Figure 6:
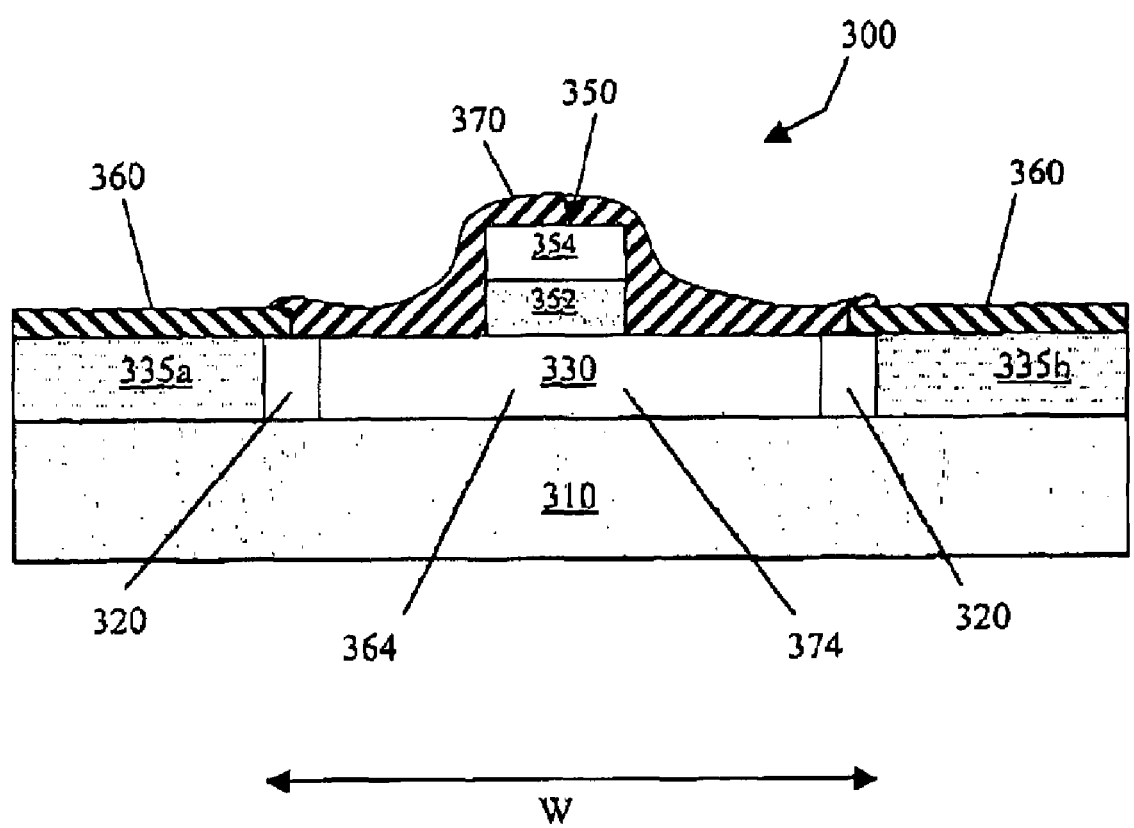
FIG. 6 shows a cross-sectional view of a semiconductor device of the present invention.

FIG. 6 shows device 300 of FIG. 5 in cross-section along transverse axis W, revealing silicide layer 335a, 335b, shallow trench isolation 320, and buried silicon dioxide (BOX) 310. Silicide layer 335a, 335b may be any material known in the art, including, for example, cobalt silicide ($CoSi_2$), titanium silicide ($TiSi_2$), molybdenum sillicide ($MoSi_2$), tungsten silicide ($WSi_2$), nickel silicide ($Ni_xSi_y$), tantalum silicide ($TaSi_2$), etc. As explained above, tensile silicon nitride liner 360 induces transverse tensile stress 364 in a portion of silicon channel 330 beneath compressive silicon nitride liner 370.

In addition, compressive silicon nitride liner 370 induces its own tensile stress 374 in the same portion of silicon channel 330, resulting in an area of increased tensile stress. That is, tensile stresses 364, 374 are additive, resulting in a combined tensile stress that is greater than either stress 364 or stress 374. As explained above, increased tensile stress improves the function of a PFET, including, for example, improved electron transport and improved hole transport.

While device 300 of FIGS. 5-6 is shown having a compressive silicon nitride liner 370 abutted along both longitudinal edges 375, 377 by tensile silicon nitride liner 360, it should be understood that tensile silicon nitride liner 360 may abut only one longitudinal edge of compressive silicon nitride liner 370.

The invention also includes methods for the manufacture of a semiconductor device having an enhanced stress state. For example, as in FIG. 6, such a device 300 may be manufactured by applying a first silicon nitride liner 360 to the device 300 and then applying a second silicon nitride liner 370 adjacent first silicon nitride liner 360, wherein at least one of the first and second silicon nitride liners 360, 370 induces a transverse stress in a silicon channel 330 beneath at least one of the first and second silicon nitride liner 360, 370.

In another embodiment, first and second silicon nitride liners 360, 370 may have different stress states. For example, first silicon nitride liner 360 may be a tensile silicon nitride liner while second silicon nitride liner 370 may be a compressive silicon nitride liner. In such an embodiment, tensile first silicon nitride liner 360 will induce a transverse tensile stress in silicon channel 330 beneath second silicon nitride liner 370 while inducing a compressive stress beneath itself. Similarly, compressive second silicon nitride liner 370 will induce a tensile stress in a silicon channel 330 beneath first silicon nitride liner 360 while inducing a tensile stress beneath itself. As explained above, where a silicon nitride liner 370 overlays a FET 350, such tensile transverse stresses may improve a function of FET 350, such as electron transport or hole transport.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A semiconductor device comprising:
   a first silicon nitride liner;
   a second silicon nitride liner laterally adjacent the first silicon nitride liner; and
   a silicon channel beneath a portion of the second silicon nitride liner;
   wherein the first silicon nitride liner induces a transverse stress in a portion of the silicon channel beneath the second silicon nitride liner that is additive in the same direction to the stress induced by the second silicon nitride liner.

2. The device of claim 1, wherein the first silicon nitride liner is a tensile silicon nitride.

3. The device of claim 1, wherein the second silicon nitride liner is a compressive silicon nitride.

4. The device of claim 1, wherein the induced transverse stress is a tensile stress under the second silicon nitride liner and compressive stress under the first silicon nitride liner.

5. The device of claim 1, wherein the induced stress improves a function of a p-channel field effect transistor beneath the second silicon nitride liner.

6. The device of claim 5, wherein the function is at least one of electron transport and hole transport.

7. A semiconductor device comprising:
   a first silicon nitride liner;
   a p-channel field effect transistor;
   a second silicon nitride liner residing substantially atop the p-channel field effect transistor, and adjacent the first silicon nitride liner; and
   a silicon channel residing substantially beneath the p-channel field effect transistor,
   wherein the first silicon nitride liner lies substantially parallel to a source-to-drain axis of the p-channel field effect transistor and induces a stress in the silicon channel substantially perpendicular to a source-to-drain axis of the p-channel field effect transistor the stress induced by the first silicon nitride liner being additive in the same direction to a stress induced by the second silicon nitride liner.

8. The device of claim 7, wherein the first silicon nitride liner is a tensile silicon nitride.

9. The device of claim 7, wherein the second silicon nitride liner is a compressive silicon nitride.

10. The device of claim 7, wherein the induced stress is a tensile stress.

11. The device of claim 7, wherein the induced stress improves a function of the p-channel field effect transistor.

12. The device of claim 11, wherein the function is at least one of electron transport and hole transport.

13. A semiconductor device comprising:
    a first silicon nitride liner;
    a second silicon nitride liner;
    a p-channel field effect transistor;
    a third silicon nitride liner residing substantially atop the p-channel field effect transistor, and adjacent the first and second silicon nitride liners; and a silicon channel residing substantially beneath the p-channel field effect transistor,
wherein each of the first and second silicon nitride liners lies substantially parallel to a source-to-drain axis of the p-channel field effect transistor and induces a stress in the silicon channel substantially perpendicular to a source-to-drain axis of the p-channel field effect transistor, the stresses induced by the first and second nitride liners being additive in the same direction to the stress induced by the third silicon nitride liner.

14. The device of claim 13, wherein each of the first and second silicon nitride liners is a tensile silicon nitride.

15. The device of claim 13, wherein the third silicon nitride liner is a compressive silicon nitride.

16. The device of claim 13, wherein the induced stress is a tensile stress.

17. The device of claim 13, wherein the induced stress improves a function of the p-channel field effect transistor.

* * * * *